United States Patent [19]

Bell et al.

[11] Patent Number: 5,039,888
[45] Date of Patent: Aug. 13, 1991

[54] METHOD AND CIRCUIT ARRANGEMENT FOR PROVIDING PROGRAMMABLE HYSTERESIS TO A DIFFERENTIAL COMPARATOR

[75] Inventors: Timothy A. Bell, Melbourne Beach; Timothy L. Blankenship, Palm Bay, both of Fla.

[73] Assignee: Harris Corporation, Melbourne, Fla.

[21] Appl. No.: 436,247

[22] Filed: Nov. 14, 1989

[51] Int. Cl.$^5$ .............................................. H03K 5/24
[52] U.S. Cl. ................................... 307/494; 307/355; 307/359
[58] Field of Search ............... 307/350, 359, 290, 491, 307/494, 355

[56] References Cited

U.S. PATENT DOCUMENTS

| | | | |
|---|---|---|---|
| 3,416,004 | 12/1968 | Taylor | 307/359 |
| 4,110,641 | 8/1978 | Payne | 307/359 |
| 4,394,587 | 7/1983 | McKenzie et al. | 307/359 |
| 4,677,315 | 6/1987 | Blauschild et al. | 307/359 |

FOREIGN PATENT DOCUMENTS 0014517 1/1987 Japan ................................. 307/359

*Primary Examiner*—John Zazworsky
*Attorney, Agent, or Firm*—Barnes & Thornburg

[57] ABSTRACT

A method and apparatus are disclosed for providing programmable hysteresis to a differential comparator. Programmable hysteresis is accomplished by adding voltage followers to the input stage and a current steering network to the output stage of the comparator such that DC bias currents flowing in the current steering network are mirrored via current mirrors so as to flow through the voltage followers at the input stage. By adding a desired offset current to one of the two input voltage follower DC bias currents in dependence on the output state of the comparator in such a manner as to provide positive feedback, an offset voltage is generated due to the unequal voltage drops of the voltage followers resulting in hysteresis which can be controlled in real-time.

10 Claims, 2 Drawing Sheets

METHOD AND CIRCUIT ARRANGEMENT FOR PROVIDING PROGRAMMABLE HYSTERESIS TO A DIFFERENTIAL COMPARATOR

BACKGROUND AND SUMMARY OF THE INVENTION

The present invention generally relates to differential comparators, and more specifically to a method and circuit arrangement for adding programmable hysteresis to differential comparators.

Differential comparators are non-linear circuits for sensing either the polarity or magnitude of an input signal. The amplifier output is one of two states, usually for representing the binary states 1 and 0. When the input signal is in excess of a predetermined threshold value (frequently 0), the amplifier output is in one state and when the input signal is less than the predetermined value, the output remains in the other state.

Hysteresis is defined as the difference in the switching point of a circuit for a rising transition and falling transition of the input signal. While generally viewed as a detriment, hysteresis can be employed advantageously in a differential comparator circuit associated with a system having an unknown noise component in which the noise can vary over a wide range in real time. In the case where the input signal has a noise component whose peak to peak value is greater than the hysteresis of the circuit, the circuit will change states back and forth (oscillate) in response to the noise as the input signal approaches the switching threshold of the circuit. Prior art circuits have their hysteresis preset for anticipated noise levels. To increase the hysteresis to be less sensitive to noise reduces the minimum detectable input level and reduces the signal to noise ratio. By providing the differential comparator circuit with a programmable hysteresis, real time noise can be compensated for by appropriately changing the hysteresis level of the comparator circuit. Further, such an approach can be employed to compensate for inter-connected systems having known, but differing noise levels in each system.

Accordingly, it is an object of the present invention to provide a method and circuit arrangement for providing a differential comparator with a programmable hysteresis.

It is a further object of the present invention to provide a method and circuit arrangement for providing a differential comparator with a digitally programmable hysteresis.

It is yet another object of the present invention to provide a method and circuit arrangement wherein the offset voltage in the input stage of a differential comparator is controlled by the output state of the comparator to provide positive feedback and generate hysteresis.

In accordance with the teachings of the present invention, there is provided a method of providing programmable hysteresis to a differential comparator having an input stage with inputs and having an output stage with at least two distinct output states. The method comprises the steps of determining the output state of the output stage and causing a desired offset voltage in the input stage in dependence on the output state of the output stage to provide positive feedback and generate hysteresis.

In accordance with the teachings of the present invention there is also provided a circuit arrangement for providing programmable hysteresis to a differential comparator having an input stage with inputs and having an output stage having at least two distinct output states comprising an output state determining circuit for determining the output state of the output stage and an input offset voltage circuit for causing a desired offset voltage in the input stage in dependence on the output state of the output stage to provide positive feedback and generate hysteresis.

In accordance with certain preferred embodiments of the present invention, the circuit arrangement for providing programmable hysteresis comprises an input offset voltage circuit including a voltage follower for each input of the input stage and an output state determining circuit including a current steering network at the output of the differential comparator. DC bias current sources provide a DC bias current in the current steering network for each input of the input stage. Also included in the current steering network is an offset current source for providing an offset current which is proportional to the level of the desired hysteresis. Current mirrors are provided for each DC bias current so that a mirrored current flows through a corresponding voltage follower of each of the inputs. A transistor circuit is also included for selectively varying one of the DC bias currents by the offset current in dependence on the output state of the output stage. Thus, the voltage of the corresponding voltage follower is varied to effect a desired input stage to produce the hysteresis and provide positive feedback.

According to advantageous features certain preferred embodiments of the present invention, an offset voltage, between the input stage voltage followers, is generated by creating a difference between the voltage follower currents. These currents are controlled by the output state of the comparator to provide positive feedback and generate hysteresis. Further, the bodies of the voltage followers can be tied to their respective sources to eliminate variations in voltage due to body effects.

The control of the voltage follower currents is facilitated by the current steering network at the output of the differential comparator which sets up a DC bias current for each input of the input stage as well as a DC offset current having a magnitude which is proportional to the level of desired hysteresis. The amount of hysteresis is further controlled by the ratio of the magnitude of the DC bias current to the magnitude of the DC offset current.

According to certain further preferred embodiments of the present invention, the magnitude of the offset current can be controlled by a digital-to-analog converter (DAC) to provide digitally programmable hysteresis. Further, a DC bias current and offset current can be generated in a manner so that they have the same temperature and process dependence thereby providing a stable and reliable circuit arrangement.

Other objects, advantages and novel features of the present invention will become apparent from the following detailed description of the invention when considered in conjunction with the accompanying drawings.

DETAILED DESCRIPTION OF THE DRAWINGS

Figure 1:
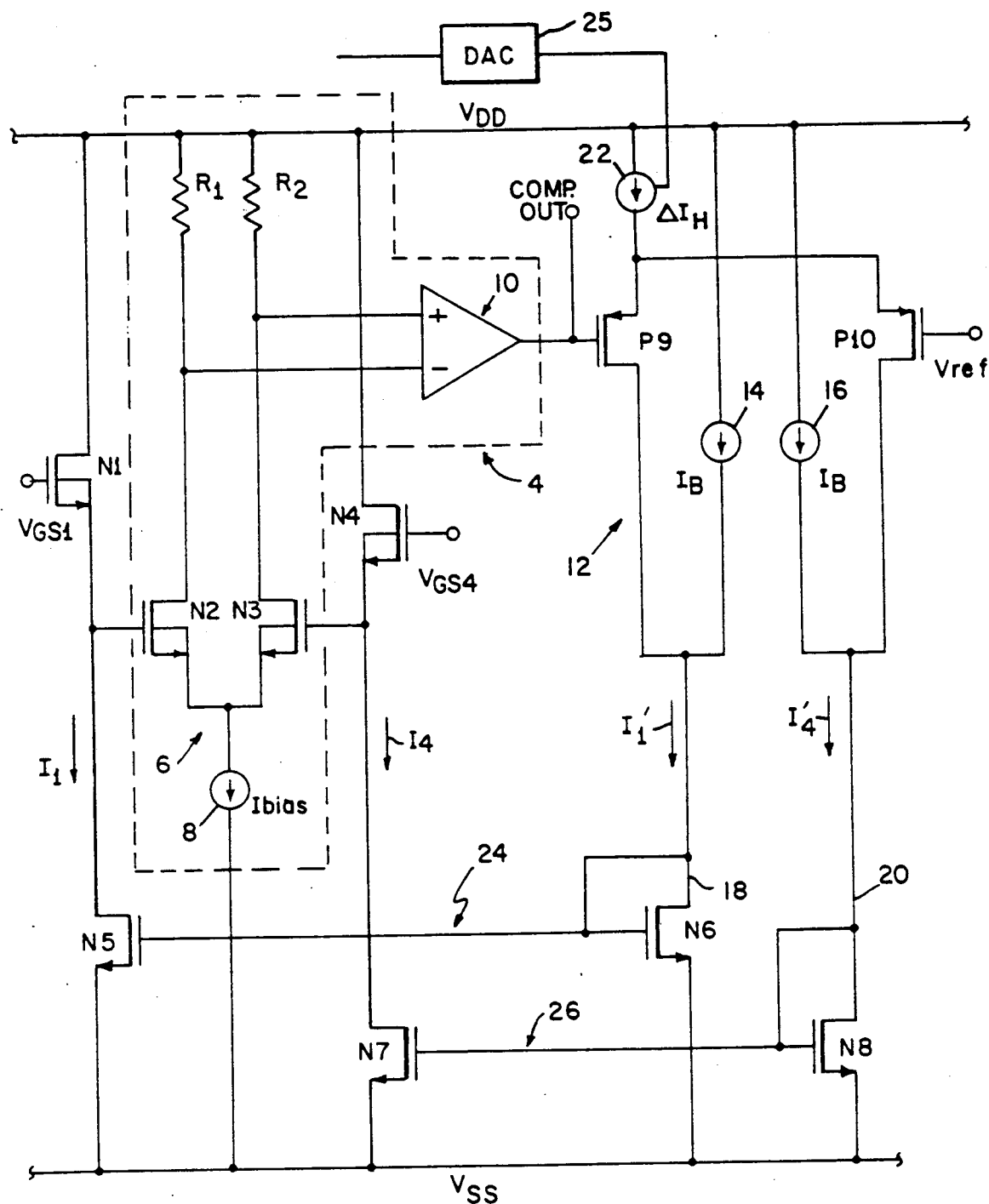
FIG. 1 is a schematic representation of the basic concept in accordance with the teachings of the present invention.

FIG. 1 schematically illustrates the basic concept of the present invention and shows a "core" comparator, generally indicated at 4, which includes an input stage 6 which can be either P-channel or N-channel and comprises transistors N2 and N3 and associated load resistances R1 and R2, having a common bias current source 8 and being connected to an output stage 10. The transistors illustrated herein, by way of example only, are CMOS although other suitable transistor types, for example bipolar, are envisioned for use in the present invention.

In accordance with the present invention, voltage followers N1, N4 are added to the input stage 6 of the comparator 4, and a current steering network 12 is added to the output stage 10 of the comparator 4. The current steering network 12 includes transistors P9 and P10 which are connected in parallel with DC bias current sources 14 and 16, respectively, which each provide a DC bias current equal to $I_B$. Further, the gate of transistor P9 is connected to the output stage 10 of the comparator 4, while the gate of transistor P10 is connected to a reference voltage V-ref. Additionally, the sources of the transistors P9 and P10 are connected to a common offset current source 22 for providing an offset current equal to $\Delta I_H$.

Ideally, $V_{ref}$ should be a fixed voltage and should be equal to ½ of the comparator output swing. The purpose of $V_{ref}$ is to set a switching threshold for the current steering transistors, P9 and P10. When the comparator's output is low, transistor P9 is switched on and transistor P10 is off and a current $I'_1$ equal in magnitude to the sum of $I_B$ and $\Delta I_H$ flows in leg 18 and a current $I'_4$ equal in magnitude to $I_B$ flows in leg 20. When the comparator's output is high, transistor P9 is switched off and transistor P10 is on, and a current $I'_4$, equal in magnitude to the sum of $I_B$ and $\Delta I_H$ flows in leg 20 and a current $I'_1$ equal in magnitude to $I_B$ flows in leg 18. As will be seen hereinafter, the current steering network 12 assures the correct polarity of a hysteresis voltage at the inputs of the input stage 6.

The current $I'_1$ in leg 18 associated with transistor P9 is mirrored by the current mirror, generally indicated at 24, comprising transistors N5 and N6 so that a corresponding current $I_1$, which is equal to the magnitude and direction of current $I'_1$, flows through transistor N1. Similarly, the current $I'_4$ which flows through leg 20 associated with transistor P10, is mirrored by a current mirror generally indicated as 26, including transistors N8 and N7 so that a current $I_4$ equal to the magnitude and direction of current $I'_4$ flows through transistor N4.

Figure 2:
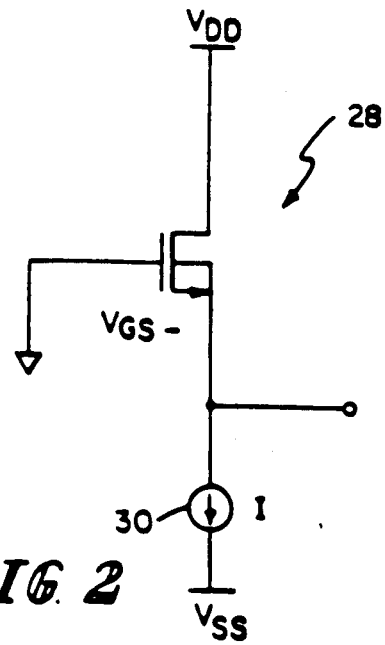
FIG. 2 is a simplified representation of one half of a hysteresis stage in accordance with the teachings of the present invention.

Referring to FIG. 2, a simplified representation of one half of the hysteresis stage is illustrated comprising a single voltage follower, generally indicated at 28, including a constant current source 30 providing a constant current I. As seen in the derivation below, the change in voltage of $V_{GS}$ is linearly dependent on the magnitude of the change of current I.

$$V_{GS} = V_{TN} + \left[\frac{2I}{K'\,W/L}\right]^{\frac{1}{2}}$$

By differentiating the above-noted equation with respect to current, the following equation results:

$$\frac{dV_{GS}}{dI} = \frac{1}{2}\left[\frac{2I}{K'\,W/L}\right]^{-\frac{1}{2}}\left[\frac{2}{K'\,W/L}\right]$$

Upon simplification of this equation, the following relation results:

$$\Delta V_{GS} = \Delta I \left[\frac{1}{2IK'\,W/L}\right]^{\frac{1}{2}}$$

wherein:

I = the constant current in the voltage follower 28 from current source 30, and $\Delta I$ = incremental current added to increase or decrease $V_{GS}$.

It can be seen in the derivation above that $\Delta V_{GS}$ is linearly dependent on the magnitude of the incremental offset current $\Delta I$.

TABLE I

| I | I + ΔI | INPUT OFFSET (ΔV_GS) VOLTAGE |
|---|---|---|
| 5.000000E-05 | 5.000000E-05 | -3.945024E-08 |
| 5.000000E-05 | 5.100000E-05 | -5.309648E-03 |
| 5.000000E-05 | 5.200000E-05 | -1.056610E-02 |
| 5.000000E-05 | 5.300000E-05 | -1.577085E-02 |
| 5.000000E-05 | 5.400000E-05 | -2.092536E-02 |
| 5.000000E-05 | 5.500000E-05 | -2.603112E-02 |

Figure 3A:
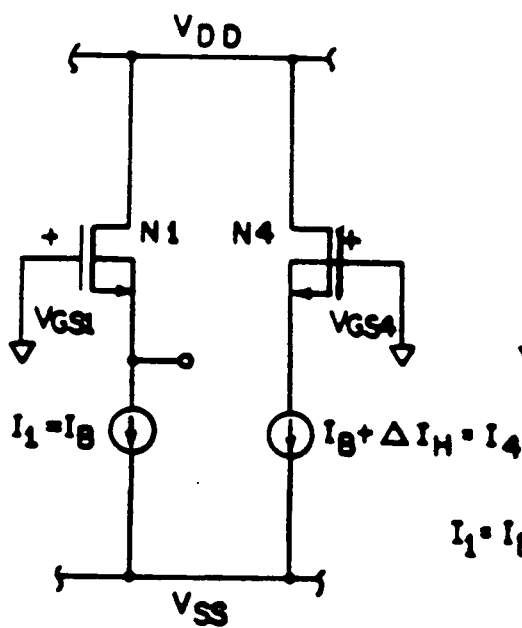
FIGS. 3A and 3B schematically illustrate the operation of the hysteresis stage in accordance with the teachings of the present invention.
Figure 3B:
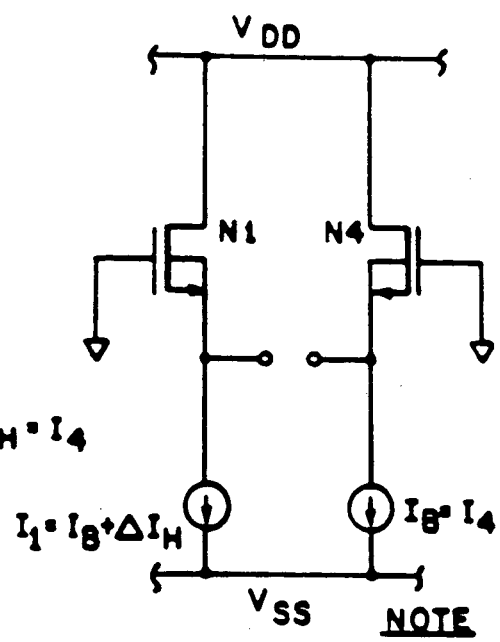

Referring now to FIGS. 3A-B, and Table I, it can be seen that:

$$\Delta V_{GS} = V_{GS1} - V_{GS4} \text{ and } \Delta V_{GS} = \Delta I\left[\frac{1}{2IK'\,W/L}\right]^{\frac{1}{2}}.$$

Hysteresis is defined as $V_H = \Delta V_{GS4} - \Delta V_{GS1}$. The values listed in Table II resulted from a simulation of the circuit illustrated by FIGS. 3A-B.

TABLE II

| I + ΔI | ΔI | INPUT OFFSET VOLTAGE | HYSTERESIS (Volts) |
|---|---|---|---|
| 5.000000E-05 | 5.000000E-05 | -3.919558E-08 | 2.546585E-10 |
| 5.100000E-05 | 5.000000E-05 | 5.309608E-03 | 1.061926E-02 |
| 5.200000E-05 | 5.000000E-05 | 1.056602E-02 | 2.113211E-02 |
| 5.300000E-05 | 5.000000E-05 | 1.577080E-02 | 3.154166E-02 |
| 5.400000E-05 | 5.000000E-05 | 2.092529E-02 | 4.185066E-02 |
| 5.500000E-05 | 5.000000E-05 | 2.603109E-02 | 5.206220E-02 |

As shown in Table II when $\Delta I$ is zero, then $I_1$ and $I_4$ are equal such that $V_{GS1}$ and $V_{GS4}$ are equal. However, if $\Delta I$ is non-zero, this forces $I_1$ and $I_4$ to be unequal and, hence, $V_{GS1}$ and $V_{GS4}$ are unequal. Table II shows that the hysteresis window is twice the voltage difference or input offset voltage between $V_{GS1}$ and $V_{GS4}$ since $V_H = \Delta V_{GS1} - (-\Delta V_{GS2})$. Further, the current steering network 12 illustrated in FIG. 1 assures the correct polarity of the hysteresis voltage at the input stage of the comparator 4.

Referring again to FIG. 1, in operation DC bias currents $I_B$ flow in the current steering network 12 along with an offset current $I_H$ which is proportional to the level of hysteresis desired. Since P9 is connected to the output stage 10 of the comparator 4, and P10 is connected to a voltage V-ref, the output of the comparator 4 will control the magnitude of the current flow in branches 18 and 20, respectively.

Thus currents, $I'_1$ and $I'_4$ are mirrored via the current mirrors 24 or 26 so that a corresponding current $I_1$ equal to $I'_1$ or $I_4$ equal to $I'_4$ flows through the transistors N1 or N4, respectively. Because an input offset voltage ($V_{GS1}$ not equal to $V_{GS4}$) is generated by the difference between the voltage follower currents $I_1$ and $I_4$ as described with respect to FIGS. 3A and 3B and both currents $I_1$ and $I_4$ can be varied as described above, both $V_{GS1}$ and $V_{GS4}$ can be varied to define the hysteresis window. These currents are controlled by the output state of the comparator 4 to provide positive feedback and generate hysteresis.

As shown in Table II, the amount of hysteresis is controlled by the ratio of the magnitude of the reference current ($I_B$) to the magnitude of the incremental current ($\Delta I_H$). In that the magnitude of $\Delta I_H$ can be controlled by, for example, a digital-to-analog converter 25, shown in FIG. 1, it is possible to further provide a digitally programmable hysteresis to the comparator 4. Other forms of an adjustable current source can offer adjustability or programmability of the hysteresis. Additionally, in order to eliminate variations in $V_T$ due to body effects, the bodies of transistors N1 and N4 are preferably tied to their respective sources. Additionally, it is preferred that the current sources for producing the reference current $I_B$ and the incremental current $\Delta I_H$ should be generated in a manner such that they have the same temperature and process dependence.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A circuit arrangement for providing programmable hysteresis to a differential comparator having an input stage with inputs and having an output stage with at least two distinct output states comprising:
   input offset voltage means for causing a desired offset voltage in the input stage in dependence on the current through the input offset voltage means;
   an offset current source means for providing an offset current having a magnitude proportional to the level of desired hysteresis;
   a DC bias current source means for providing a DC bias current for each input of the input stage;
   transistor means responsive to the output state of the output stage for varying at least one of the DC bias currents by the offset current; and
   current mirror means for mirroring a respective DC bias current through the input offset voltage means to drive the input offset voltage means to shift the inputs of the input stage to a desired level in dependence on the output state of the output stage.

2. An arrangement according to claim 1, wherein the offset voltage means includes voltage follower means connected to each input of the input stage.

3. An arrangement according to claim 2, wherein each voltage follower includes a field effect transistor having a body tied to a respective source of said field effect transistor to eliminate variations in voltage due to body effects.

4. An arrangement according to claim 1, further comprising a digital-to-analog converter for controlling the magnitude of the offset current to provide digitally programmable hysteresis.

5. An arrangement according to claim 1, wherein each DC bias current source means and offset current source means has the same temperature and process dependence.

6. An arrangement according to claim 1, further comprising control means for selectively varying said offset current to vary the desired offset voltage in the input stage.

7. A circuit arrangement for providing programmable hysteresis to a differential comparator having an input stage with inputs and having an output stage with at least two distinct output states, comprising:
   output state determining means for determining the output state of the output stage of the comparator;
   input offset voltage means, including a variable bias current source for each input of the input stage, for causing a desired offset voltage in the input stage in dependence on the output state of the output stage;
   the output determining means including:
   a) an offset current source for providing an offset current having a magnitude proportional to the level of desired hysteresis;
   b) means for varying the bias current sources by the offset current to drive the input offset voltage means to symmetrically shift the inputs of the input stage to a desired level in dependence on the output state of the output stage.

8. An arrangement according to claim 7, further comprising a digital-to-analog converter for controlling the magnitude of the offset current to provide digitally programmable hysteresis.

9. An arrangement according to claim 7, further comprising control means for selectively varying said offset current to vary the desired offset voltage of the inputs of the input stage.

10. An arrangement according to claim 7, wherein each variable bias current source and offset current source has the same temperature and process dependence.

* * * * *